(12) United States Patent
Yang et al.

(10) Patent No.: US 7,615,492 B2
(45) Date of Patent: Nov. 10, 2009

(54) PREPARING METHOD OF CNT-BASED SEMICONDUCTOR SENSITIZED SOLAR CELL

(75) Inventors: Tsun-Neng Yang, Taipei (TW);
Shan-Ming Lan, Taoyuan County (TW);
Ying-Ru Chen, Chiayi County (TW);
Chin-Chen Chiang, Taoyuan County (TW); Wei-Yang Ma, Taipei County (TW); Chien-Te Ku, Taoyuan County (TW)

(73) Assignee: Atomic Energy Council - Institute of Nuclear Energy Research, Taoyuan (TW)

( * ) Notice: Subject to any disclaimer, the term of this patent is extended or adjusted under 35 U.S.C. 154(b) by 563 days.

(21) Appl. No.: 11/490,167

(22) Filed: Jul. 21, 2006

(65) Prior Publication Data
US 2008/0032497 A1 Feb. 7, 2008

(51) Int. Cl.
*H01L 21/44* (2006.01)

(52) U.S. Cl. .............. 438/680; 438/106; 438/289; 257/E21.17; 257/E21.617; 257/E31.115; 257/E51.038

(58) Field of Classification Search .......... 438/69, 438/75, 106, 289, 680, 686, 931
See application file for complete search history.

(56) References Cited

U.S. PATENT DOCUMENTS

| | | | | |
|---|---|---|---|---|
| 6,835,613 B2* | 12/2004 | Schlaf | | 438/199 |
| 7,112,816 B2* | 9/2006 | Schlaf et al. | | 257/24 |
| 7,288,490 B1* | 10/2007 | Delzeit | | 438/758 |
| 7,336,474 B2* | 2/2008 | Lerche et al. | | 361/248 |
| 7,378,328 B2* | 5/2008 | Choi et al. | | 438/381 |
| 7,452,452 B2* | 11/2008 | Ren et al. | | 204/400 |
| 7,462,890 B1* | 12/2008 | Tombler et al. | | 257/192 |
| 7,465,494 B2* | 12/2008 | Ren et al. | | 428/367 |

* cited by examiner

*Primary Examiner*—David Nhu (57) ABSTRACT

A solar cell is prepared. The solar cell is photo-sensitized. The solar cell has a semiconductor layer. And carbon nanotubes are deposited on the semiconductor layer with an arrangement. The solar cell is prepared with a reduced amount of fabrication material, a lowered fabrication cost and a prolonged lifetime.

19 Claims, 9 Drawing Sheets

PREPARING METHOD OF CNT-BASED SEMICONDUCTOR SENSITIZED SOLAR CELL

FIELD OF THE INVENTION

The present invention relates to a solar cell preparing method; more particularly, relates to reducing an amount of fabrication material, lowering a fabrication cost and prolonging a lifetime of a solar cell.

DESCRIPTION OF THE RELATED ARTS

A prior art is proclaimed in Taiwan, called "Solar cell and solar module." The prior art comprises a photoelectronic converter layer having an upper surface and a down surface; an anode thin layer on the upper surface comprising an anode conductor extending from an edge of the a node thin layer; a cathode thin layer on the down surface comprising a cathode conductor extending from an edge of the cathode thin layer; and at least one separator being deposed at the outside surface of the photoelectronic converter layer for quarantining. The photoelectronic converter layer comprises a dye photo-sensitized layer having an electrolysis and so the prior art is a dye-sensitized solar cell.

To the modern time, solar cells can be divided into several categories. They are crystalline silicon solar cells having single crystal silicon, polycrystalline silicon and belt/sheet shape silicon; solar cells having thin film silicon and/or single crystal silicon in a mixed structure or a focusing structure amorphous-silicon or chemical-semiconductor solar cells; and newly invented dye-sensitized solar cells. The crystalline silicon solar cell uses expansive materials accompanied with a too high fabrication cost to be popular. The dye-sensitized solar cell has a low cost, though; its lifetime is short and its implementation is limited. Hence, the prior arts do not fulfill users' requests on actual use.

SUMMARY OF THE INVENTION

The main purpose of the present invention is to reduce an amount of fabrication material, to lower a fabrication cost and to prolong a lifetime of a solar cell.

To achieve the above purpose, the present invention is a preparing method of a carbon-nanotube (CNT) based semiconductor sensitized solar cell, comprising steps of: (a) plating a thin layer on a surface of a conductive substrate; (b) obtaining a CNT layer with at least one CNT on the thin layer through a plasma enhanced chemical vapor deposition or a screen printing; (c) obtaining a polymer having silicon quantum dots adhered to each CNT through a chemical vapor deposition, through being soaked in a polymer solution having silicon quantum dots, or through coating a polymer solution having silicon quantum dots; (d) plating a transparent conductive layer on said CNT layer through an ion sputtering or an electron gun evaporation; and (e) setting a voltage source at the outside of the structure with an end connecting to the transparent conductive layer and another end connecting to the conductive substrate. Accordingly, a novel preparing method of a CNT-based semiconductor sensitized solar cell is obtained.

BRIEF DESCRIPTION OF THE DRAWINGS

The present invention will be better understood from the following detailed descriptions of the preferred embodiments according to the present invention, taken in conjunction with the accompanying drawings, in which.

DESCRIPTION OF THE PREFERRED EMBODIMENTS

The following descriptions of the preferred embodiments are provided to understand the features and the structures of the present invention.

Figure 1:
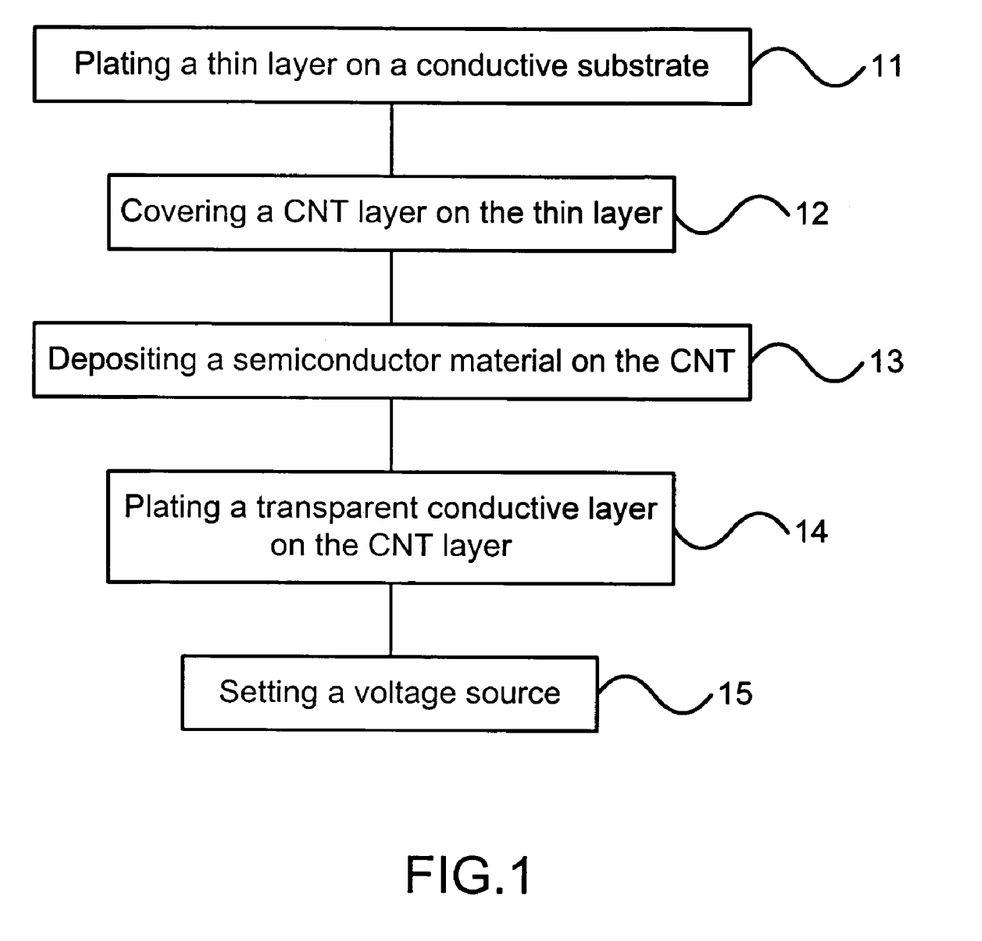
FIG. 1 is a view showing the flow chart of the first preferred embodiment according to the present invention.
Figure 2A:
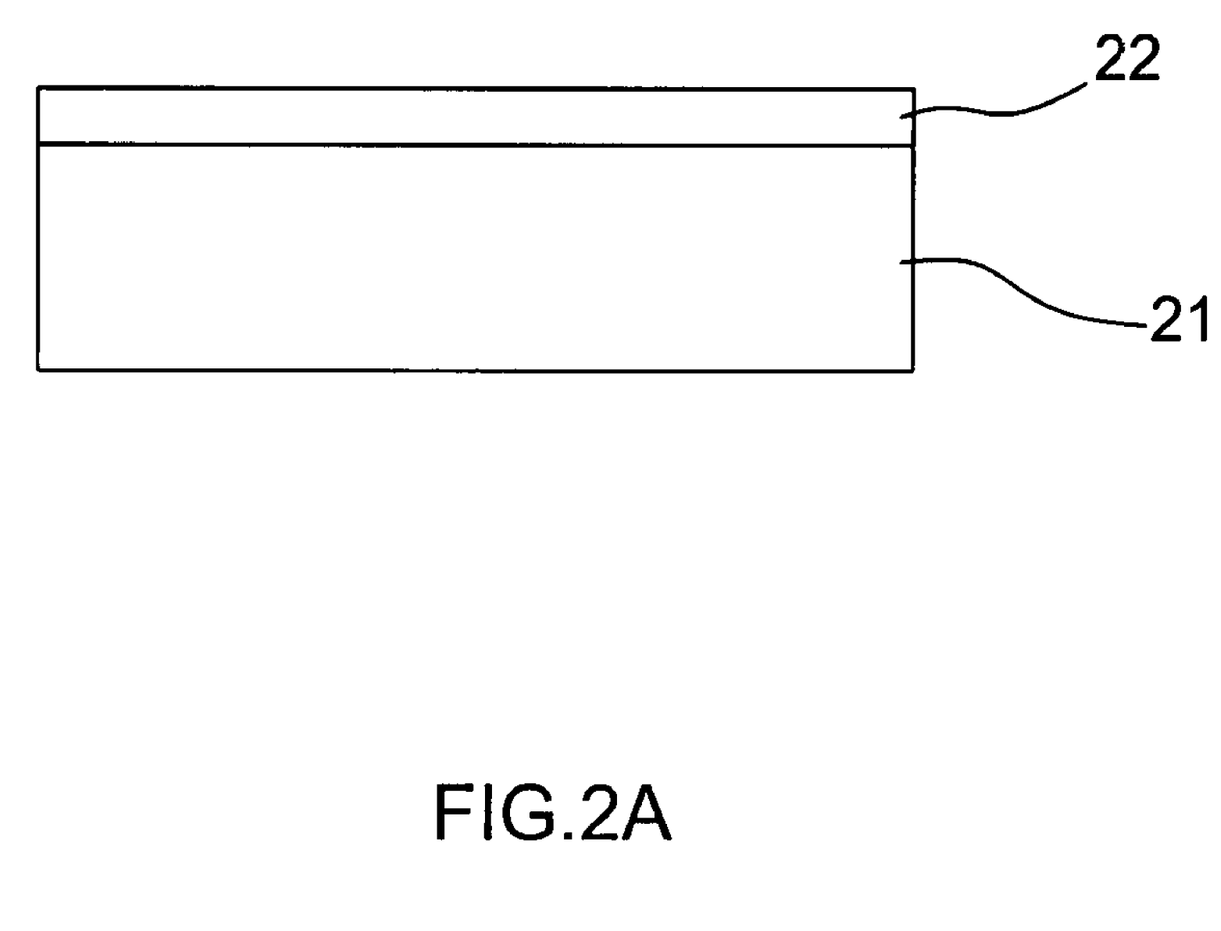
FIG. 2A to FIG. 2E are structural views showing step (a) to step (e)

Please refer to FIG. 1 and FIG. 2A to FIG. 2F, which are a view showing a flow chart of the first preferred embodiment according to the present invention, structural views showing step (a) to step (e), and a view showing the state of use. As shown in the figures, the present invention is a preparing method of a carbon-nanotube (CNT) based semiconductor sensitized solar cell, comprising the following steps:

(a) Plating a thin layer on a conductive substrate 11: A thin layer 22 is plated on a conductive substrate 21, where the conductive substrate 21 is made of silicon, aluminum or a conductive glass; the thin layer 22 is made of iron, cobalt, nickel, molybdenum or a mixture of any or some of the above metals having active particles for catalysis; and the thin layer 22 has an image.

Figure 2B:
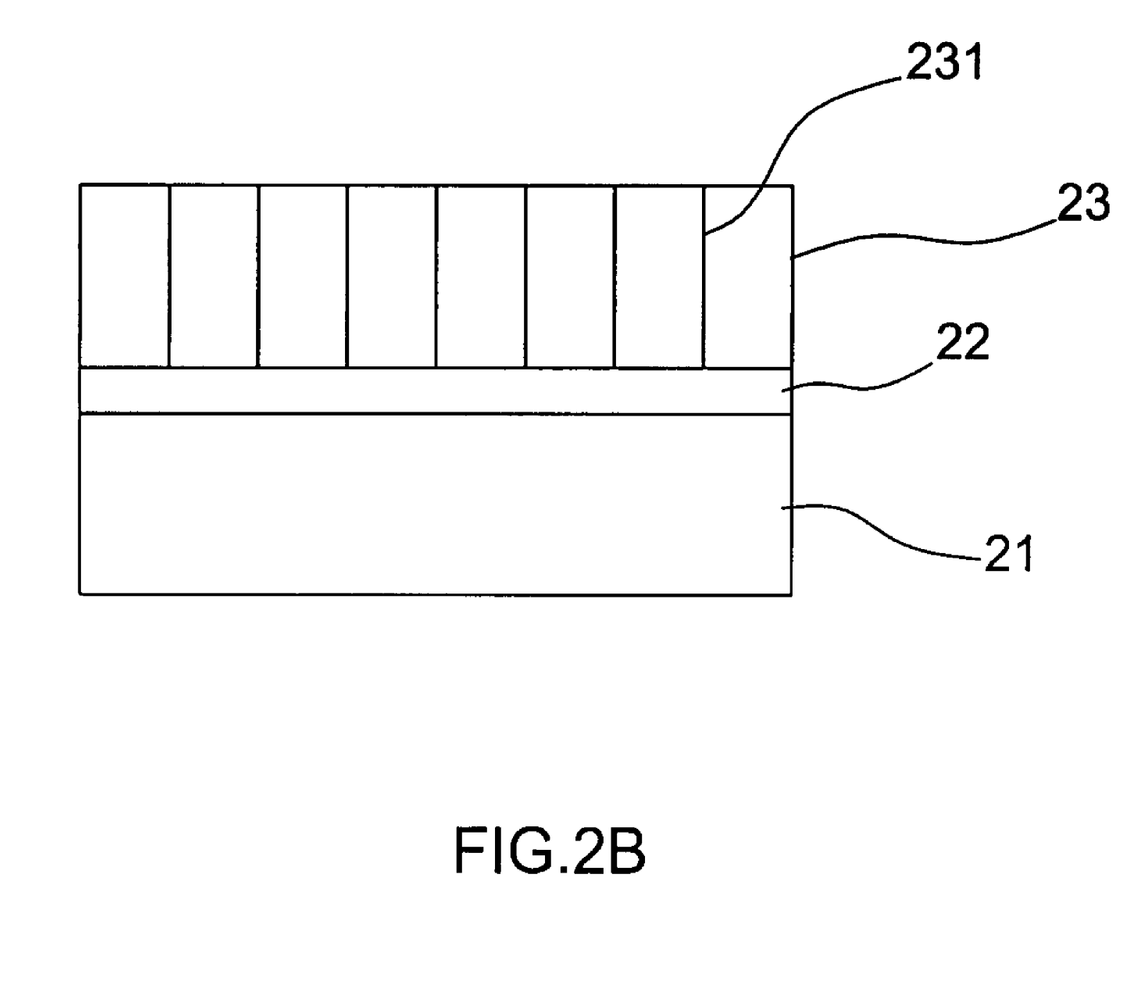

(b) Covering a CNT layer on the thin layer 12: A CNT layer 23 is covered on the thin layer 22 and the CNT layer 23 has at least one CNT 231, where the CNT layer is obtained through a plasma enhanced chemical vapor deposition (PECVD) to obtain the CNT 231 on the thin layer 22 with an arrangement; or is obtained through a screen printing method by printing or brushing a CNT polymer on the thin layer 22.

Figure 2C:
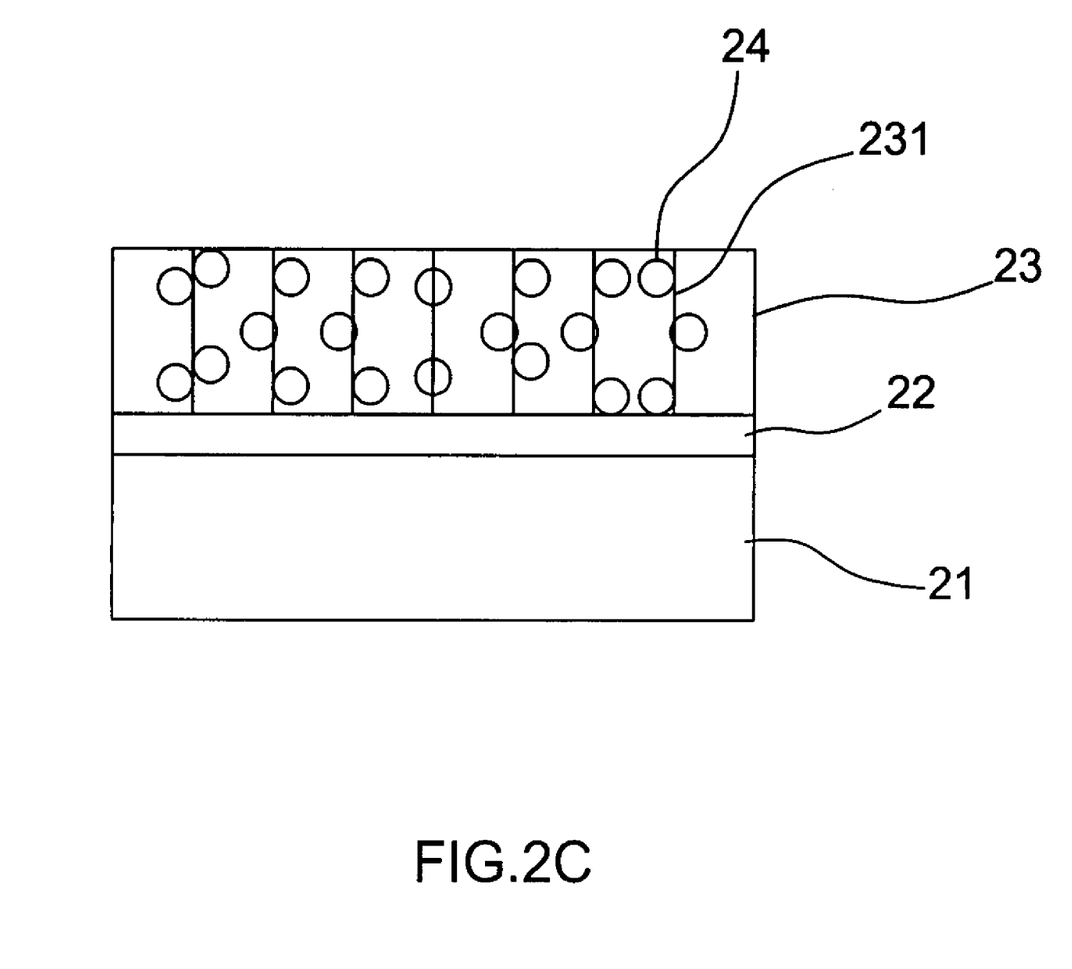

(c) Depositing a semiconductor material on the CNT 13: A semiconductor material 24 is deposited on each CNT 231 through a chemical vapor deposition (CVD), where the CVD is a PECVD or an atmospheric pressure plasma chemical vapor deposition (AP-PCVD); and the semiconductor material 24 is made of silicon, silicon carbide, silicon nitride, indium nitride or indium phosphide.

Figure 2D:
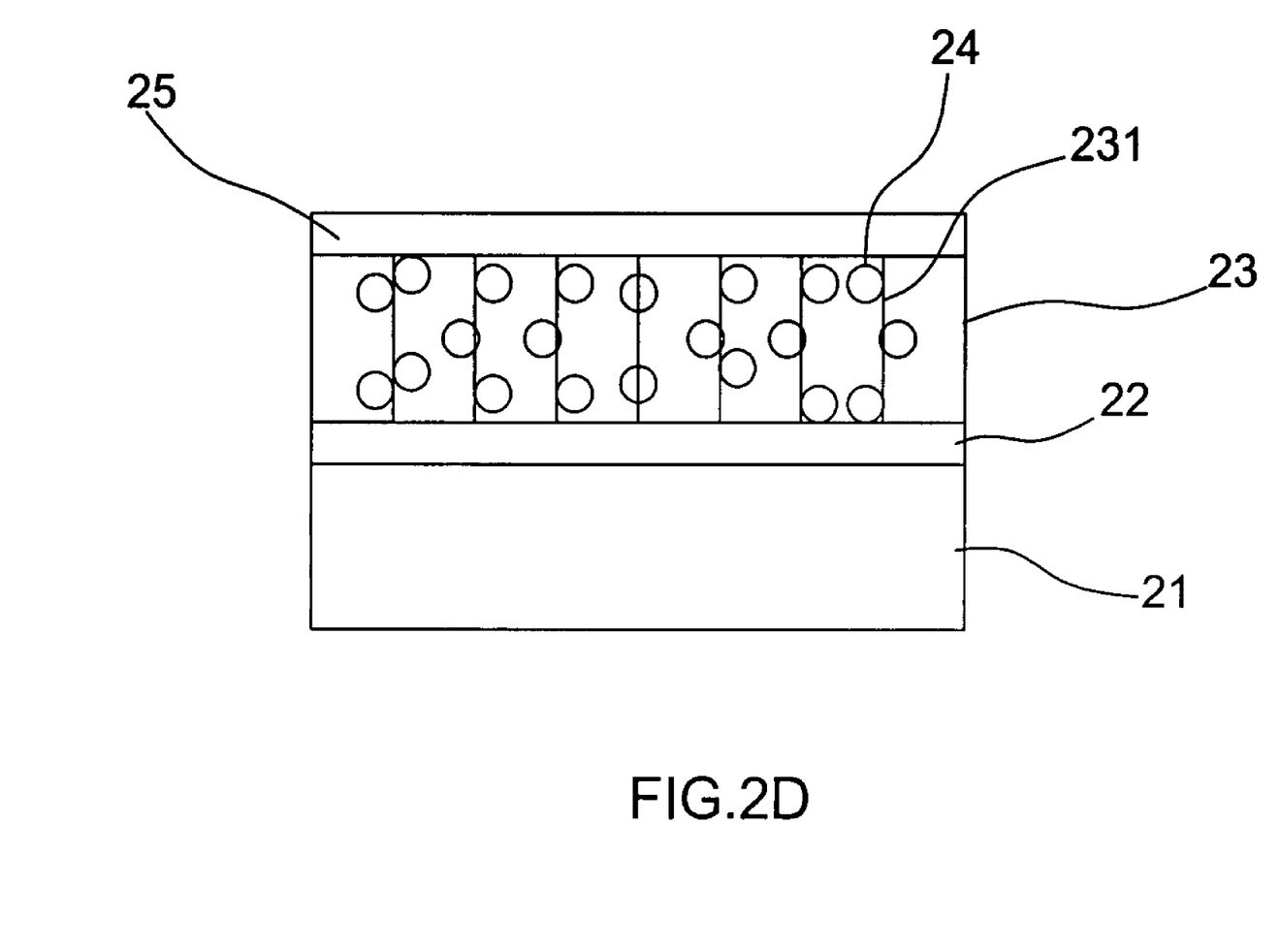

(d) Plating a transparent conductive layer on the CNT layer 14: A transparent conductive layer is plated on the CNT layer 23, where the transparent conductive layer 25 is made of titanium nitride and is plated on the CNT layer 23 through an ion sputtering; or is made of indium tin oxide (ITO) and is plated on the CNT layer 23 through an electron gun evaporation.

Figure 2E:
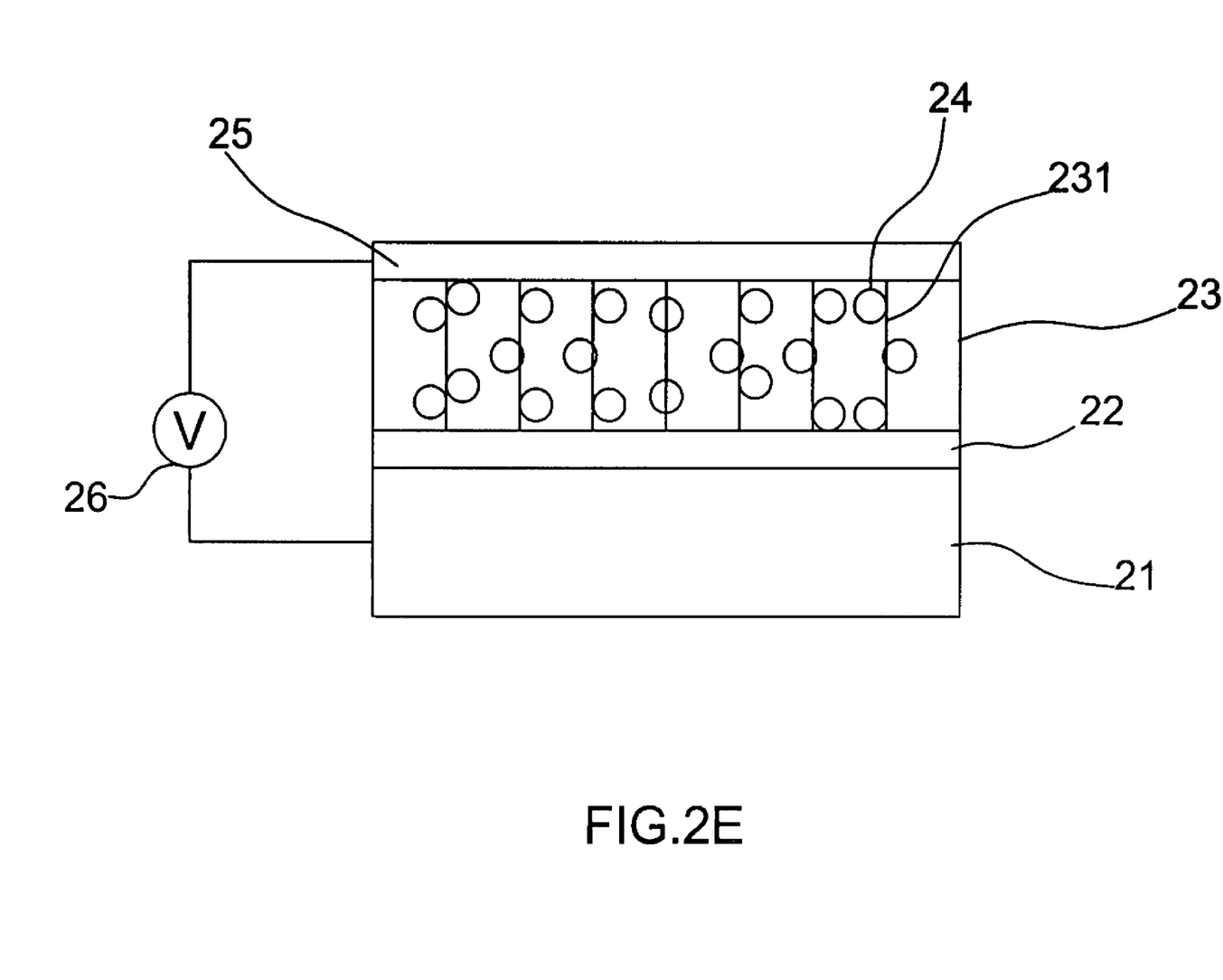

(e) Setting a voltage source 15: A voltage source 26 is set at the outside of the structure obtained through step (a) till step (d) with an end connecting to the transparent conductive layer 25 and another end connecting to the conductive substrate 21.

Thus, a novel preparing method of a CNT-based semiconductor sensitized solar cell is obtained.

Figure 2F:
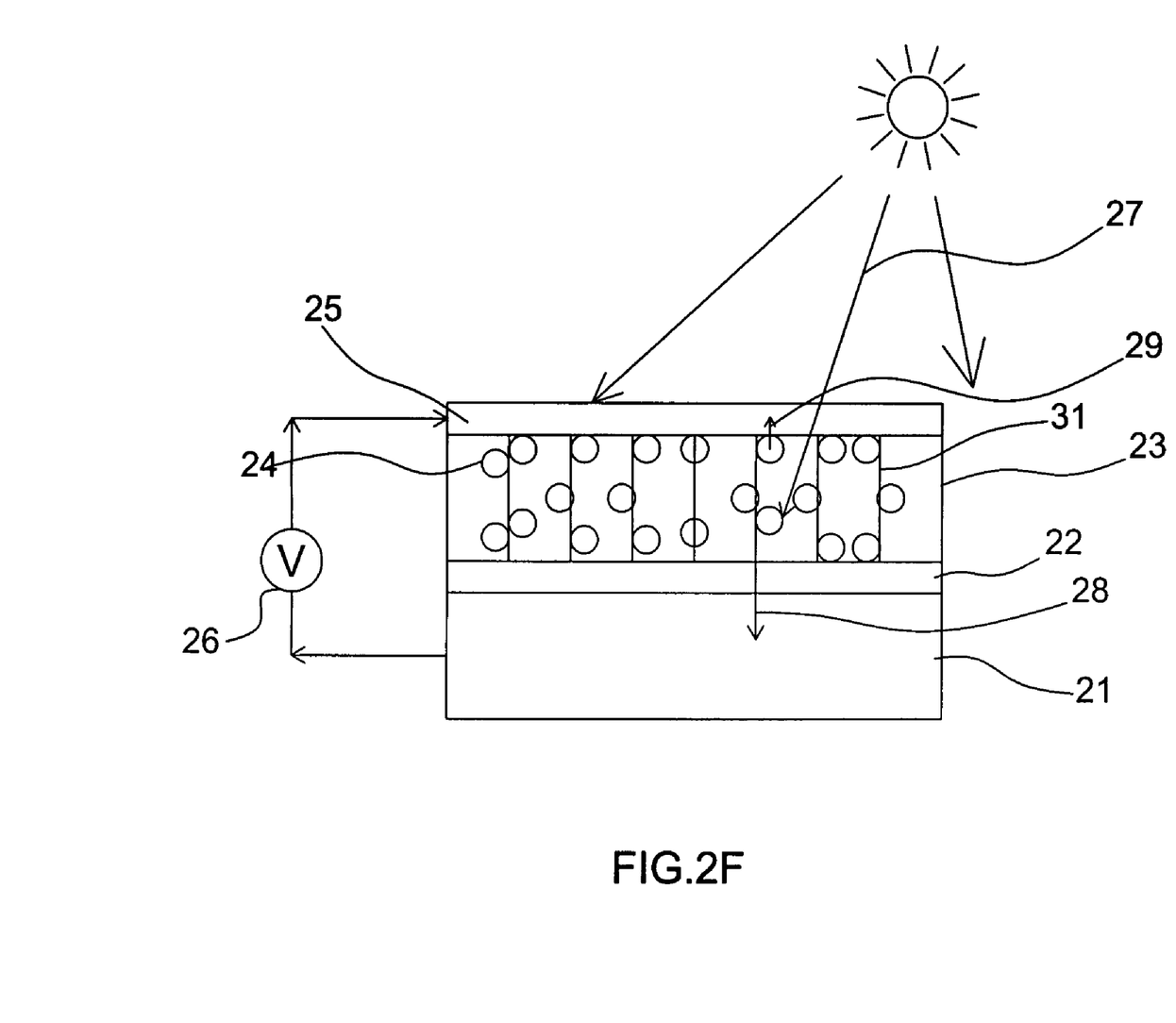
FIG. 2F is a view showing the state of use.

By putting a solar cell made through the above steps according to the first preferred embodiment in an environment having a sunlight 27, owing to the semiconductor material 24 deposited on the CNT 231, the sun light 27 excites the semiconductor material on the CNT 231 to produce excitons. Electron-and-hole pairs are thus separated. The electrons 28 are transferred to the conductive substrate 21 through the CNT 231; the holes 29 are transferred to the transparent conductive layer 25 through the semiconductor material 24; and, as a result, the structure is connected with the voltage source 26 to form an electric circuit.

Figure 3:
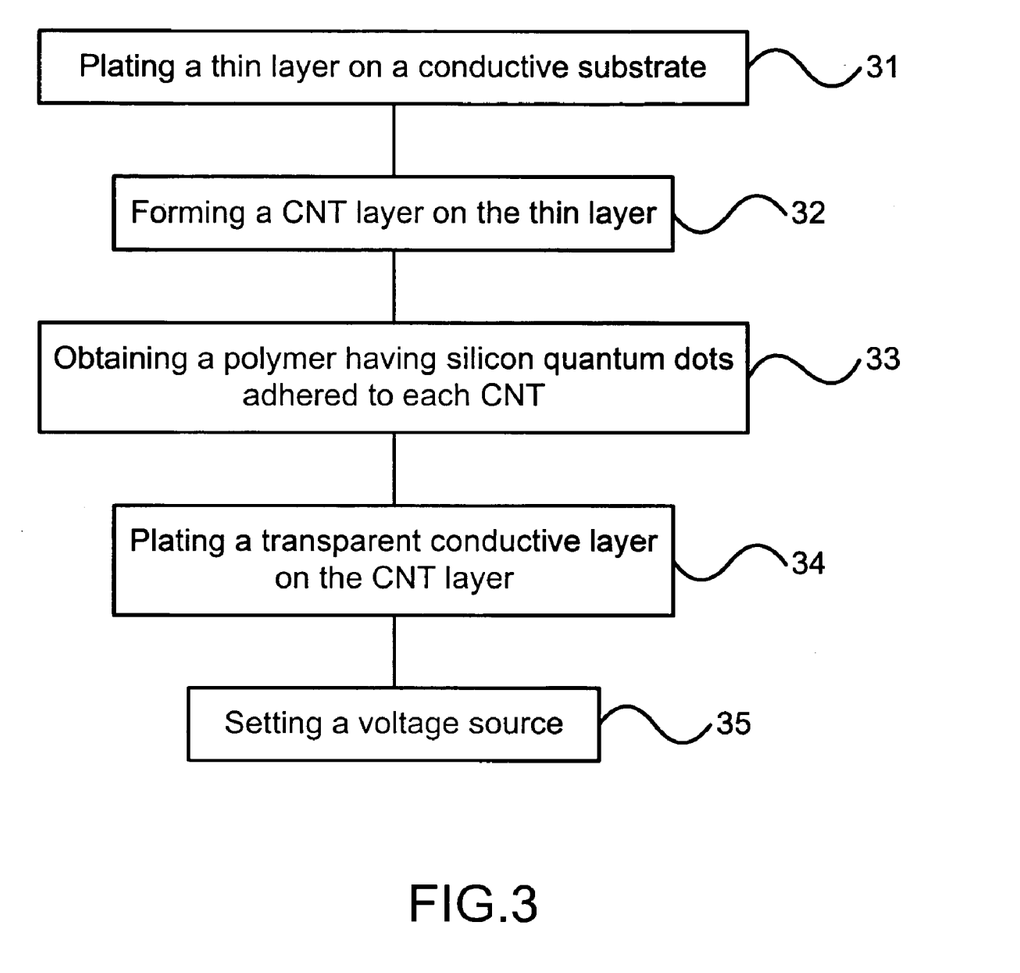
FIG. 3 is a view showing the flow chart of the second preferred embodiment.

Please refer to FIG. 3, which is a view showing a flow chart of a second preferred embodiment. As shown in the figure, the present invention is a preparing method of a CNT-based semiconductor sensitized solar cell, comprising the following steps:

(a1) Plating a thin layer on a conductive substrate 31: A thin layer is plated on a conductive substrate made of silicon, where the conductive substrate can be made of aluminum or a conductive glass, too; and the thin layer is made of iron, cobalt, nickel, molybdenum or a mixture of any or some of the above metals having active particles for catalysis.

(b1) Forming a CNT layer on the thin layer 32: Through a plasma enhanced chemical vapor deposition (PECVD), at least one CNT is obtained with an arrangement on the thin layer to form a CNT layer. Or, the CNT layer is formed through a screen printing method by printing or brushing a CNT polymer on the thin layer.

(c1) Obtaining a polymer having silicon quantum dots adhered to each CNT 33: A structure obtained through step (a1) and step (b1) is soaked in a polymer solution having silicon quantum dots to obtain a polymer having silicon quantum dots adhered to every CNT.

(d1) Plating a transparent conductive layer on the CNT layer 34: A transparent conductive layer made of titanium nitride is plated on the CNT layer through an ion sputtering. Or, the transparent conductive layer is made of ITO and is plated on the CNT layer through an electron gun evaporation.

(e1) Setting a voltage source 35: A voltage source is set at the outside with an end connecting to the transparent conductive layer and another end connecting to the conductive substrate.

Thus, a novel preparing method of a CNT-based semiconductor sensitized solar cell is obtained.

Figure 4:
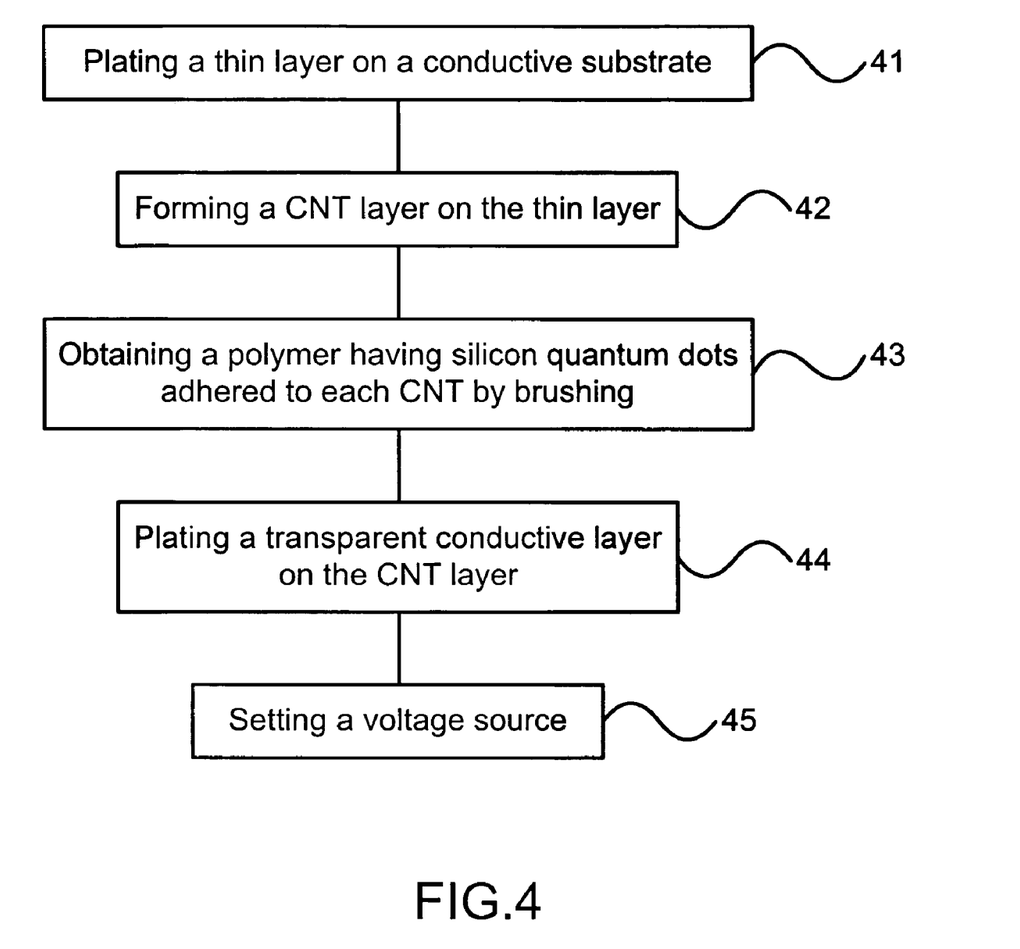
FIG. 4 is a view showing the flow chart of the third preferred embodiment.

Please refer to FIG. 4, which is a view showing a flow chart of a third preferred embodiment. As shown in the figure, the present invention is a preparing method of a CNT-based semiconductor sensitized solar cell, comprising the following steps:

(a2) Plating a thin layer on a conductive substrate 41: A thin layer is plated on a conductive substrate made of conductive glass, where the conductive substrate can be made of silicon or aluminum, too; and the thin layer is made of iron, cobalt, nickel molybdenum or a mixture of any or some of the above metals having active particles for catalysis.

(b2) Forming a CNT layer on the thin layer 42: Through a screen printing method, a CNT polymer is printed or brushed on the thin layer to form a CNT layer. Or, the CNT layer is formed through a plasma enhanced chemical vapor deposition (PECVD) to obtain at least one CNT on the thin layer with an arrangement.

(c2) Obtaining a polymer having silicon quantum dots adhered to each CNT by brushing 43: A polymer solution having silicon quantum dots is brushed through a coating method on each CNT to obtain a polymer having silicon quantum dots adhered to every CNT.

(d2) Plating a transparent conductive layer on the CNT layer 44: A transparent conductive layer made of ITO is plated on the CNT layer through an electron gun evaporation. Or, the transparent conductive layer is made of titanium nitride to be plated on the CNT layer through an ion sputtering.

(e2) Setting a voltage source 45: A voltage source is set at the outside with an end connecting to the transparent conductive layer and another end connecting to the conductive substrate.

Thus, a novel preparing method of a CNT-based semiconductor sensitized solar cell is obtained.

To sum up, the present invention is a preparing method of a CNT-based semiconductor sensitized solar cell, where an amount of fabrication material is reduced; a fabrication cost is lowered and a lifetime of a solar cell is prolonged.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A preparing method of a carbon-nanotube (CNT) based semiconductor sensitized solar cell, comprising:
    (a) plating a thin layer on a surface of a conductive substrate;
    (b) covering a CNT layer on said thin layer, said CNT layer having at least one CNT;
    (c) obtaining a semiconductor material adhered on every one of said CNT through a chemical vapor deposition (CVD);
    (d) plating a transparent conductive layer on said CNT layer; and
    (e) obtaining a voltage source, said voltage source connecting to said transparent conductive layer at an end of said voltage source and connecting to said conductive substrate at another end of said voltage source.

2. The method according to claim 1, wherein said conductive substrate is made of a material selected from a group consisting of silicon, aluminum and a conductive glass.

3. The method according to claim 1, wherein said thin layer is made of a material selected from a group consisting of iron; cobalt; nickel, molybdenum; and a mixture of metals selected from a group consisting of iron, cobalt, nickel, and molybdenum.

4. The method according to claim 1, wherein said thin layer has an image.

5. The method according to claim 1, wherein said CNT layer in step (b) is obtained through a plasma enhanced chemical vapor deposition (PECVD) to obtain at least one CNT deposed on said thin layer with an arrangement.

6. The method according to claim 1, wherein said CNT layer in step (b) is obtained through a screen printing to depose a layer of CNT polymer on said thin layer through a method selected from a group consisting of printing and brushing.

7. The method according to claim 1, wherein said CVD in step (c) is selected from a group consisting of a PECVD and an atmospheric pressure plasma chemical vapor deposition (AP-PCVD).

8. The method according to claim 1, wherein said semiconductor material in step (c) is made of a material selected from a group consisting of silicon, silicon carbide, silicon nitride, indium nitride and indium phosphide.

9. The method according to claim 1, wherein said transparent conductive layer in step (d) is made of titanium nitride and said transparent conductive layer is plated on said CNT layer through an ion sputtering.

10. The method according to claim 1, wherein said transparent conductive layer in step (d) is made of indium tin oxide and said transparent conductive layer is plated on said CNT layer through an electron gun evaporation.

11. A preparing method of a CNT-based semiconductor sensitized solar cell, comprising:
    (a1) plating a thin layer on a surface of a conductive substrate;

(b1) obtaining a CNT layer on said thin layer, said CNT layer having at least one CNT;

(c1) soaking a structure obtained through step (a1) and step (b1) in a polymer solution having silicon quantum dots to obtain a polymer having silicon quantum dots adhered to every one of said CNT;

(d1) plating a transparent conductive layer on said CNT layer; and (e1) obtaining a voltage source, said voltage source connecting to said transparent conductive layer at an end of said voltage source and connecting to said conductive substrate at another end of voltage source.

12. The method according to claim 11, wherein said conductive substrate is made of a material selected from a group consisting of silicon, aluminum and a conductive glass.

13. The method according to claim 11, wherein said thin layer is made of a material selected from a group consisting of iron; cobalt; nickel, molybdenum; and a mixture of metals selected from a group consisting of iron, cobalt, nickel, and molybdenum.

14. The method according to claim 11, wherein said thin layer has an image.

15. The method according to claim 11, wherein said CNT layer in step (b) is obtained through a plasma enhanced chemical vapor deposition (PECVD) to arrange at least one CNT deposed on said thin layer.

16. The method according to claim 11, wherein said CNT layer in step (b) is obtained through a screen printing to depose a layer of CNT polymer on said thin layer through a method selected from a group consisting of printing and brushing.

17. The method according to claim 11, wherein said transparent conductive layer in step (d1) is made of titanium nitride and said transparent conductive layer is plated on said CNT layer through an ion sputtering.

18. The method according to claim 11, wherein said transparent conductive layer in step d1 is made of indium tin oxide and said transparent conductive layer is plated on said CNT layer through an electron gun evaporation.

19. A preparing method of a CNT-based semiconductor sensitized solar cell, comprising:

(a2) plating a thin layer on a surface of a conductive substrate;

(b2) obtaining a CNT layer on said thin layer, said CNT layer having at least one CNT;

(c2) coating a polymer solution having silicon quantum dots on every one of said CNT to obtain a polymer having silicon quantum dots adhered to each of said CNT;

(d2) plating a transparent conductive layer on said CNT layer; and (e2) obtaining a voltage source, said voltage source connecting to said transparent conductive layer at an end of said voltage source and connecting to said conductive substrate at another end of said voltage source.

* * * * *